United States Patent [19]
Propst et al.

[11] Patent Number: 5,431,766
[45] Date of Patent: Jul. 11, 1995

[54] SYSTEM FOR THE PHOTOELECTROCHEMICAL ETCHING OF SILICON IN AN ANHYDROUS ENVIRONMENT

[75] Inventors: Eric K. Propst; Paul A. Kohl, both of Atlanta, Ga.

[73] Assignee: Georgia Tech Research Corporation, Atlanta, Ga.

[21] Appl. No.: 278,658

[22] Filed: Sep. 2, 1994

Related U.S. Application Data

[62] Division of Ser. No. 61,090, May 12, 1993, Pat. No. 5,348,627.

[51] Int. Cl.$^6$ ............................................. C23F 1/02
[52] U.S. Cl. .................................................. 156/345
[58] Field of Search ............ 204/129.35, 129.3, 129.75, 204/129.8; 156/345, 626, 627, 637, 662

[56] References Cited

U.S. PATENT DOCUMENTS

| | | | |
|---|---|---|---|
| 4,039,371 | 8/1977 | Brunner et al. | 156/668 |
| 4,256,602 | 3/1981 | McLaughlin, Jr. | 252/142 |
| 4,482,443 | 11/1984 | Bacon et al. | 204/129.3 |
| 4,582,624 | 4/1986 | Enjo et al. | 252/79.4 |
| 5,019,425 | 5/1991 | Römer et al. | 427/305 |
| 5,071,510 | 12/1991 | Findler et al. | 156/647 |
| 5,100,495 | 3/1992 | Ohmi et al. | 156/345 |
| 5,135,779 | 8/1992 | Viehbeck et al. | 427/443.1 |
| 5,139,624 | 8/1992 | Searson | 204/129.3 |
| 5,306,647 | 4/1994 | Lehmann | 437/2 |
| 5,338,416 | 8/1994 | Mlcak | 204/129.3 |

Primary Examiner—R. Bruce Breneman
Assistant Examiner—Joni Y. Chang
Attorney, Agent, or Firm—Hopkins & Thomas

[57] ABSTRACT

The photoelectrochemical oxidation and dissolution of silicon (Si) is performed in the absence of water and oxygen. Etch rates and photocurrents in an anhydrous HF-acetonitrile (MeCN) solution are directly proportional to light intensity up to at least 600 mW/cm2, producing a spatially selective etch rate of greater than 4 μm/min. Four electron transfer reactions per silicon molecule occur with a quantum yield greater than 3.3 due to electron injection from high energy reaction intermediates. Further, the electrochemical oxidation of p-doped silicon in HF-MeCN results in the formation of porous silicon which electroluminescence in an aqueous solution. In an aprotic electrolyte, where tetrabutylammonium tetrafluoroborate (TBAFB) is used as both the supporting electrolyte and source of fluoride in MeCN, photo-induced etching of n-doped silicon occurs at quantum efficiency of 1.9. This indicates that the oxidation and dissolution mechanism of Si in MeCN can occur without protons.

8 Claims, 4 Drawing Sheets

SYSTEM FOR THE PHOTOELECTROCHEMICAL ETCHING OF SILICON IN AN ANHYDROUS ENVIRONMENT

This is a divisional of application Ser. No. 08/061,090 filed on May 12, 1993, now U.S. Pat. No. 5,348,627.

FIELD OF THE INVENTION

The present invention generally relates to etching of semiconductors, and more particularly, to a process and system for the photoelectrochemical etching of silicon in an anhydrous electrolytic solution for permitting high speed and selective etching of silicon at a rate proportional to light intensity.

BACKGROUND OF THE INVENTION

Great advances have been made in semiconductor technology in the last decade due to the discovery of new fabrication techniques. The revolution in semiconductor technology has been most apparent in the silicon semiconductor industry. Most semiconductor devices are made with silicon, because silicon is readily available in large boules, has excellent mechanical properties, can be easily purified, and is relatively well understood as far as semiconductor properties are concerned.

In fabricating silicon semiconductor devices, it would be highly advantageous to have an etching procedure which can be controlled as to etch rate, area to be etched, and geometrical shape to be etched. Such an etching procedure is usually referred to as an anisotropic etching procedure. Such a procedure would be useful for making any type of three-dimensional features in silicon, for example, channels, via holes, mirrors, lenses, and diffraction gratings.

It is known that photoelectrochemical (PEC) etching may be utilized to implement an anisotropic etching procedure. The PEC etching of III-V semiconductor compounds has been described in a variety of publications, including U.S. Pat. No. 4,482,443 issued to Bacon et al. on Nov. 13, 1984; U.S. Pat. No. 4,389,291, issued to P. A. Kohl et al. on Jun. 21, 1983; U.S. Pat. No. 4,399,004, issued to R. R. Buckley et al. on Aug. 16, 1983; U.S. Pat. No. 4,404,072, issued to P. A. Kohl et al. on Sep. 13, 1983; and D. Lubzens, "Photoetching of InP Mesas for Production of MM-Wave Transferred Oscillators," *Electronics Letters*, 13, page 171 (1977). Generally, in the prior art, the PEC etching of silicon is performed by placing silicon in an aqueous electrolytic solution containing a fluoride and then exposing the silicon to light radiation.

However, in these aqueous systems for PEC etching, the reactions involve complex interactions between direct fluoride complexation and indirect dissolution through oxide intermediates, such as $SiO_2$, and the associated liberation of hydrogen gas. In this regard, see H. Gerishcer and M. Lubke, *Ber. Busenges. Phys. Chem.*, 91, 394 (1987) and H. Gerischer and M. Lubke, *Ber. Busenges. Phys. Chem.*, 92, 573 (1988). The formation of the oxide intermediates and their relatively slow dissolution rates results in an overall reaction rate that is not directly proportional to light intensity as desired. The formation or involvement of silicon oxides, which may exist in many different stoichiometries referred to herein generally as $SiO_x$, requires that the rate of etching as well as the spatial resolution of the etch features be dependent on the dissolution rate of the silicon oxides $SiO_x$. This predicament leads to low etch rates and lateral diffusion of photogenerated holes which reduces the spatial resolution. Moreover, the formation of hydrogen gas at the silicon surface diffracts the incident radiation, thereby disrupting any imposed spatial gradient of light intensity. The complex reactions also produce surface structures that are strongly dependent on the reaction conditions which are present.

SUMMARY OF THE INVENTION

Briefly described, the present invention is a process and system for selective high speed etching of silicon (Si) and involves the following. A silicon semiconductor is placed in an electrolytic solution. The silicon semiconductor may be amorphous, crystalline, or polycrystalline material, and may be n-doped or p-doped. The electrolytic solution is substantially anhydrous and has a fluoride source, for example but not limited to, hydrofluoric acid (HF), fluoroborate ($BF_4^-$), tetrabutylammonium tetrafluoroborate (TBAFB), aluminum hexaflouride ($AlF_6^{3-}$), and hydrogen difluoride ($HF_2^-$). A potential is applied to the semiconductor. The potential is between the maximum potential of the valence band of the semiconductor and the minimum potential of the conduction band of the semiconductor. Finally, a surface part of the semiconductor is illuminated in order to be etched with radiation of sufficient energy to produce holes in the valence band. While under bias and illuminated, electron hole pairs are created in the semiconductor. Electrons migrate toward the bulk of the semiconductor and eventually flow to a counter electrode. The photogenerated holes migrate to the surface where the holes oxidize the semiconductor. At the surface, the semiconductor is complexed with fluoride to form a soluble species, generally silicon hexafluoride $SiF_6^{2-}$.

A novel feature of the process is that the reaction system is anhydrous in that the reaction system contains no water and also no oxygen-containing species, unlike standard aqueous methodologies. This feature eliminates the formation of oxide intermediates that slows the rate of dissolution. The formation of hydrogen gas is also eliminated. Moreover, the etch rate is directly proportional to light intensity, thereby permitting spatially varying light intensity over the surface and etching of three-dimensional microelectronic surface features, such as integral lenses, diffraction gratings, through-wafer via-holes, and trench capacitors.

Other advantages of the present invention result from the use of TBAFB in the electrolytic solution. In addition to being an anhydrous electrolyte, TBAFB forms an aprotic electrolyte where no protons, or hydrogen ions $H^+$, are present. One advantage is that TBAFB is a nontoxic material that is easily handled as a solid at room temperature. This represents a considerable improvement in safety and process logistics. Another advantage is that the solubility characteristics of TBAFB result in an electrolytic solution that readily dissolves photo-oxidized silicon, but does not dissolve silicon oxides ($SiO_x$), particularly silicon dioxide ($SiO_2$). Thus, when using TBAFB, $SiO_x$ layers may be exposed on the surface of the semiconductor without fear of complexation or depletion.

Still another advantage of the present invention is that porous silicon semiconductors may be produced which are luminescent when biased in an aqueous electrolytic solution. In order to produce luminescent porous silicon, the following photoelectrochemical etching process is followed. A silicon semiconductor is placed in an electrolytic solution. The electrolytic solution is substantially anhydrous and has fluoride. Moreover, a potential is applied to the semiconductor which is between the maximum potential of the valence band of the semiconductor and the minimum potential of the conduction band of the semiconductor. If the silicon semiconductor is p-doped, then the etching reaction will ensue without radiation, but radiation can facilitate the reaction. If the silicon semiconductor is n-doped, then a surface part of the semiconductor to be etched is radiated with sufficient energy to produce holes in the valence band.

Other objects, features, and advantages of the present invention will become apparent to one of skill in the art upon examination of the following drawings and detailed description.

BRIEF DESCRIPTION OF THE DRAWINGS

The present invention can be better understood with reference to the following drawings. The drawings are not necessarily to scale, emphasis instead being placed upon clearly illustrating principles of the present invention.

DETAILED DESCRIPTION OF THE PREFERRED EMBODIMENTS

The present invention involves a novel photoelectrochemical (PEC) etching process and system for silicon (Si) in which the etching process is carried out in an anhydrous electrolytic solution, which contains less than about 50 ppm water (H$_2$O) but preferably less than about 5 ppm water, and which contains a fluoride source. The nature of the electrolytic solution is of particular importance in assuring high speed etch rates and in assuring an etch rate which is directly proportional to light intensity. The process involves applying a potential of a certain voltage to either n-doped or p-doped Si, while irradiating the area to be etched with radiation of sufficient energy to produce holes in the valence band of the Si. To better understand the invention, the process and system for performing the process are described below, together with the critical process parameters for achieving best results.

Figure 1:
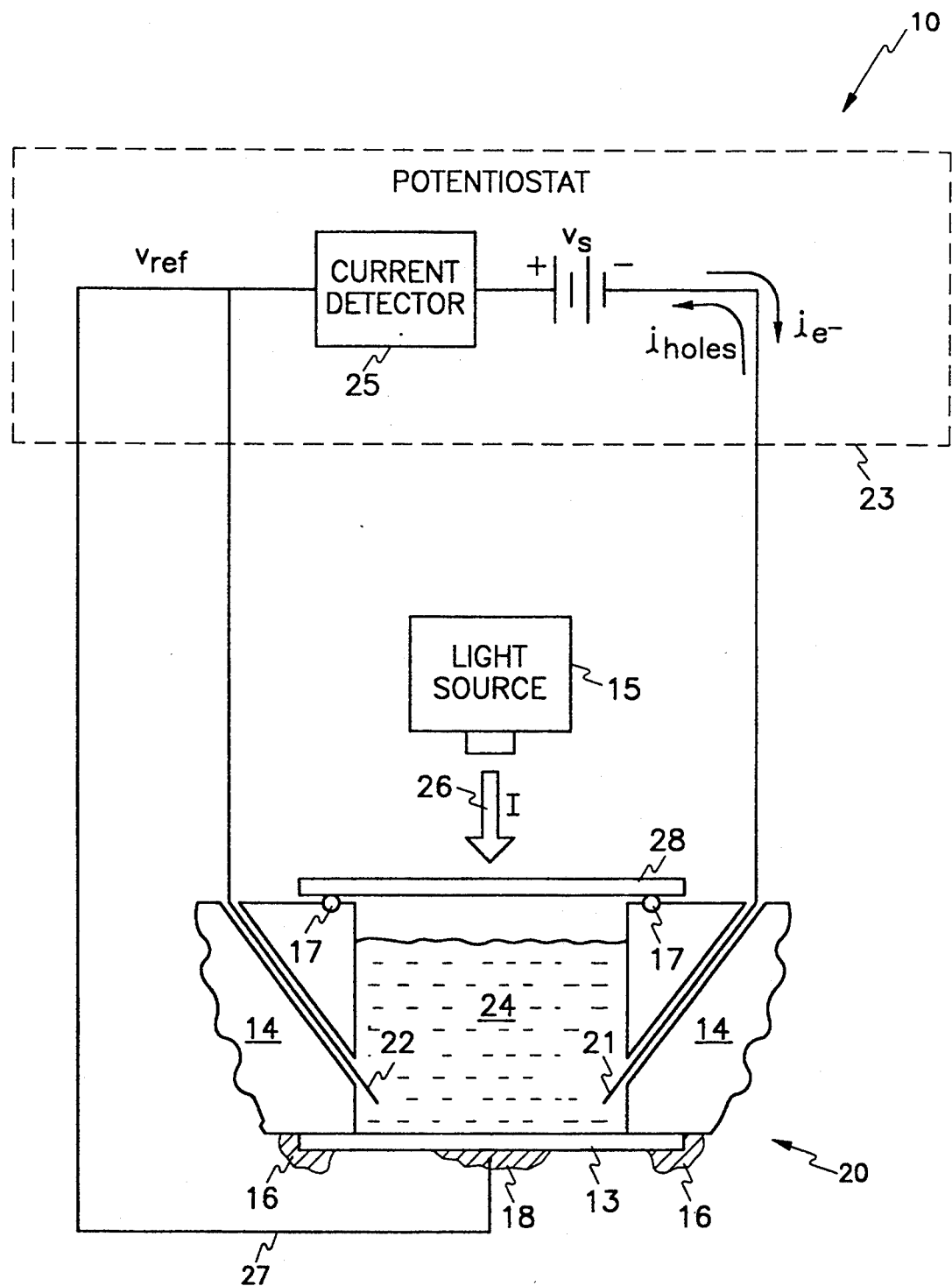
FIG. 1 is a schematic view of a system for practicing the present invention.

The PEC etching process of the present invention is carried out in a system 10 shown in FIG. 1. In the system 10, light 26 with intensity I is projected by a light source 15 onto the surface of a Si semiconductor 13, which is in contact with an electrolytic solution 24 in a cell 20, in order to etch the Si semiconductor 13 at high speed and at an etch rate which is proportional to the light intensity I. In other words, the light intensity I may be selectively varied to thereby selectively vary the rate of etching. The cell 20 may have many geometric configurations and may be made of any suitable material for supporting the Si semiconductor 13 and for containing the electrolytic solution 24 having fluoride ions. The specific configuration of the cell 20 may be optimized for high volume industrial applications. However, in the preferred embodiment, the cell 20 is formed by drilling a cylindrical hole in a teflon block to form a cell body 14, by bonding the Si semiconductor 13 to the bottom of the teflon cell body 14 with a bonding agent 16, such as an epoxy, and by covering the top of the cell body 14 with a lid 20 which is preferably transparent, such as a glass or sapphire lid, and which is sealed to the body 14 via an O-ring 17, such as teflon. A counter-electrode 21, usually an inert metal, preferably platinum or platinized titanium, extends into the electrolytic solution 24 through the cell body 14. Further, a reference electrode 22 also extends into the electrolytic solution 24 through the cell body 14. The reference electrode 22 establishes a reference voltage v$_{ref}$ and is usually formed from a metal wire, such as a silver (Ag) wire, for convenience, from a saturated calomel electrode (SCE), or from any other electrode mechanism.

The electrochemical reaction occurring in the cell 20 is electrically powered and monitored by a potentiostat 23, which is well known in the art. The potentiostat 23 comprises a current detector 25 connected in series with a source voltage v$_s$ for applying a potential across the electrodes 21, 22 and a connection 27, which connects the potentiostat 23 to the Si semiconductor 13. The connection 27 is affixed to the Si semiconductor 13 via any bonding mechanism 18, for example, an Gain island. As further shown in FIG. 1, the potentiostat 23 generates a flow i$_{e-}$ of electrons e$^-$ in the circuit. Note that the flow i$_{e-}$ of electrons e$^-$ is in a direction opposite to the flow i$_{holes}$ of holes in the circuit shown.

In the PEC etching process carried out in the system 10 of FIG. 1, the Si semiconductor 13 is made part of an oxidation-reduction reaction. The Si semiconductor 13 is made the anode and the counter-electrode 21 is made the cathode. A potential is applied to the Si semiconductor 13 via the connection 27, the value of which must be carefully adjusted as is more fully discussed hereinafter. The reference electrode 22 is used in the process to measure and monitor the potential. Etching results from a decomposition reaction induced by photogenerated holes at the interface between the Si semiconductor 13 and the electrolytic solution 24.

The novel PEC etching process of the present invention is applicable to a Si semiconductor 13 which is amorphous, crystalline, or polycrystalline. Moreover, the PEC etching process is applicable to both an n-doped and p-doped Si semiconductor 13, but is most applicable to an n-doped Si semiconductor. In the case of an n-doped Si semiconductor, the n-doped dopants are con, only phosphorous, arsenic, or a similar substance, and generally the n-doped dopant concentration is in the range from 10$^{15}$ to 10$^{19}$ atoms per cubic centimeter.

The surface to be etched on the Si semiconductor 13 is irradiated with light from the light source 15 of sufficient energy to generate holes in the valence band of the Si. The holes which are generated become available at the interface between Si semiconductor 13 and electrolytic solution 24. Generally, this predicament requires light radiation 26 with energy approximately equal to or greater than the bandgap of the Si semiconductor 13 (about 1.12 electron volts at room temperature), but various kinds of impurity states of the Si semiconductor 13 might permit the same results for radiation 26 of slightly lower energy. For this purpose, the light source 15 may comprise either a broadband light source, for example, a fluorescent light or mercury lamp, or a monochromic light source, for example, a laser. Filters may also be employed with broadband light sources to remove unwanted light radiation.

For all practical purposes, the desired etching takes place in the presence of radiation 26, and the etching rate is proportional to the intensity of the radiation 15. Thus, etching is limited to areas of the Si surface where radiation 15 (of the sufficient energy) is incident on the Si surface. Also, the nature of the radiation 26, that is, the ray direction and spatial intensity variation, can be used to produce various geometrical features on the Si surface. For example, use of collimated light radiation 26 through a mask results in straight-walled geometric features, such as holes and slots. See U.S. Pat. No. 4,389,291 issued to P. A. Kohl et al. on Jun. 21, 1983. Also, judiciously planned intensity variations in the incident radiation 26 can give rise to such geometrical features as lenses, etc. See, for example, U.S. Pat. No. 4,415,414 for a discussion of lenses.

The source voltage $v_s$ applies the potential on the Si semiconductor 13 via the connection 27 and drives the oxidation-reduction reaction occurring within the cell 20. The current detector 25 is used to measure the potential applied to the Si semiconductor 13 by measuring the electron current flow. The current is proportional to the etch rate and therefore is a convenient monitor for the PEC etching process.

The potential applied to the Si semiconductor 13 to be etched is particularly important because too high a potential will lead to etching in the absence of radiation 26 and too low a potential will prevent any etching even in the presence of radiation 26. As a general criteria, the potential should be between the maximum potential of the valence band edge of the Si semiconductor 13 in the particular electrolytic solution 24 being used and the flat band potential under these same conditions. The flat band potential is approximately the conduction band minimum for an n-doped Si semiconductor 13 and about halfway between the valence and conduction band for an intrinsic Si semiconductor 13. Often, these potentials are known or can be found from various literature references. A typical value for n-doped Si is about $-0.2$ volts to $+1.0$ volts (versus SCE) in the electrolytic solution 24 containing fluoride ions.

The applied potential (i.e., the source voltage $v_s$) differs considerably from the potential at the semiconductor surface because of the insulating layer between Si semiconductor 13 and electrolytic solution 24 and the high voltage drop in the electrolytic solution 24. For these reasons, the applied potentials (i.e., the source voltage $v_s$) are usually in the range from about 1 volt to 5 volts, so as to ensure the required voltage for generation of holes on the surface of the Si semiconductor 13.

In order to determine the best applied voltage under a particular set of experimental conditions, the current $i_{e-}$ is measured as a function of applied source voltage $v_s$ both with and without radiation 26 incident on the surface of the Si semiconductor 13. In a particular region of applied source voltage $v_s$, high etching (as evidenced by high current) is observed with radiation, but essentially no etching (near zero current) without radiation. It is this particular region of applied source voltage $v_s$ that is of interest in the PEC etching process of the present invention.

The light source 15 must provide sufficient energy to create holes in the valence band at the surface of the Si semiconductor 13. The foregoing requirement is most easily met by providing radiation 26 with energy equal to or greater than the bandgap of the Si semiconductor 13 (about 1.12 electron volts). Under some circumstances, light energy less than the bandgap of the Si semiconductor 13 may be used because of energy states in the bandgap. Often, these energy states are due to impurities, doping elements, compensation elements, and crystal imperfections. However, for convenience and etching speed, radiation 26 with energy greater than the bandgap is preferred. Broadband radiation (as from a tungsten lamp) or essentially monochromatic radiation (as from a laser) may be used. Lenses and other optical means may be used to achieve desired ray direction, concentration of radiation, etc.

For many applications, a mask (not shown) may be used to confine the radiation 26 (and therefore the etching) to specific regions of the Si semiconductor 13. Masks may also be used to vary the etching rate over some portion of the semiconductor surface by varying the light transmission over some portion of the semiconductor surface. Partially reflecting or absorbing masks may also be used. Often photographic emulsions are used in making such masks. Ray direction in the applied radiation is also significant. For example, parallel rays through a mask can be used to etch features with straight walls such as holes or slots with straight, right-angled walls.

The nature of the electrolytic solution 24 is of great importance in the practice of the invention. Preferably, the electrolytic solution 24 is an anhydrous solution generally having less than 50 ppm water and contains no oxygen-containing species. The electrolytic solution 24 comprises an anhydrous solvent, for example but not limited to, an acetonitrile ($CH_3CN$; MeCN), dimethyl formamide (DMF), dimethyl sulfoxide (DMSO), propylene carbonate ($C_3O_3H_6$), or methylene chloride ($CH_2Cl_2$). Moreover, the electrolytic solution 24 has a supporting electrolyte, for example but not limited to, tetrabutylammonium perchlorate ($C_{16}H_{36}NClO_4$) and tetramethylammonium perchlorate ($C_4H_{12}NClO_4$). Further, the electrolytic solution 24 includes an anhydrous source of fluoride, for example but not limited to, hydrofluoric acid (HF), fluoroborate ($BF_4^-$), tetrabutylammonium tetrafluoroborate (TBAFB), aluminum hexaflouride ($AlF_6^{3-}$), and hydrogen difluoride ($HF_2^-$). Other solvents, electrolytes, and fluoride sources are envisioned and are possible for practicing the present invention.

Set forth hereinafter are details concerning specific experimentation examples using the system 10 of FIG. 1. Obviously, the details of these examples may be varied to an extent and are not intended to be limiting of the present invention. These examples have been chosen and set forth merely to illustrate and describe the fundamental principles of the present invention.

EXAMPLE 1

The n-doped (100) Si semiconductors 13 used in this experimentation were obtained from MEMC of Dallas, Tex. U.S.A. The n-doped Si semiconductors 13 were doped with phosphorous to a resistivity of about 1 to 10 ohm cm. Ohmic contacts were made to the semiconductors 13 by coating the back with a gallium indium alloy, forming a tunnel diode. Each Si semiconductor 13 was placed within the teflon cell 20. To protect the MeCN electrolytic solution 24 from atmospheric moisture and oxygen, the solution 24 was placed in the cell 20 while in a conventional inert atmosphere dry box (not shown), manufactured by and commercially available from Vacuum Atmospheres Co., Hawthorne, Calif. U.S.A. The oxygen and water content in the dry box were each maintained below 2 ppm. The cell 20 containing the electrolytic solution 24 was covered with a glass window 28 to enable experimentation outside of the dry box.

Anhydrous acetonitrile ($<$50 ppm $H_2O$) was obtained from Aldrich Chemical Co. Inc., Milwaukee, Wis. U.S.A. and was further purified to less than about 5 ppm water. Electrochemical grade tetrabutylammonium perchlorate (TBAP), obtained from Fluka Chemical Corp., Ronkonkoma, N.Y. U.S.A., was used as the supporting electrolyte in the solution 24. Semiconductor purity anhydrous HF was obtained from Matheson Gas Products, East Rutherford, N.J., U.S.A. Reagent grade aqueous HF from J. T. Baker, Phillipsburg, N.J. U.S.A., and was used in the present invention. Reagent grade ammonium hydroxide from Fisher Scientific, Fair Lawn, N.J. U.S.A., was used to buffer the solution 24.

The potentiostat 23 was obtained from EG&G PARC 273, Princeton, N.J. U.S.A. A 270 W quartz tungsten halogen lamp was used as the light source 15 to generate a maximum white light intensity of 600 mW/$cm^2$. A 0.62 mW HeNe laser with a beam width of 0.47 mm was also used as the light source 15.

Figure 2:
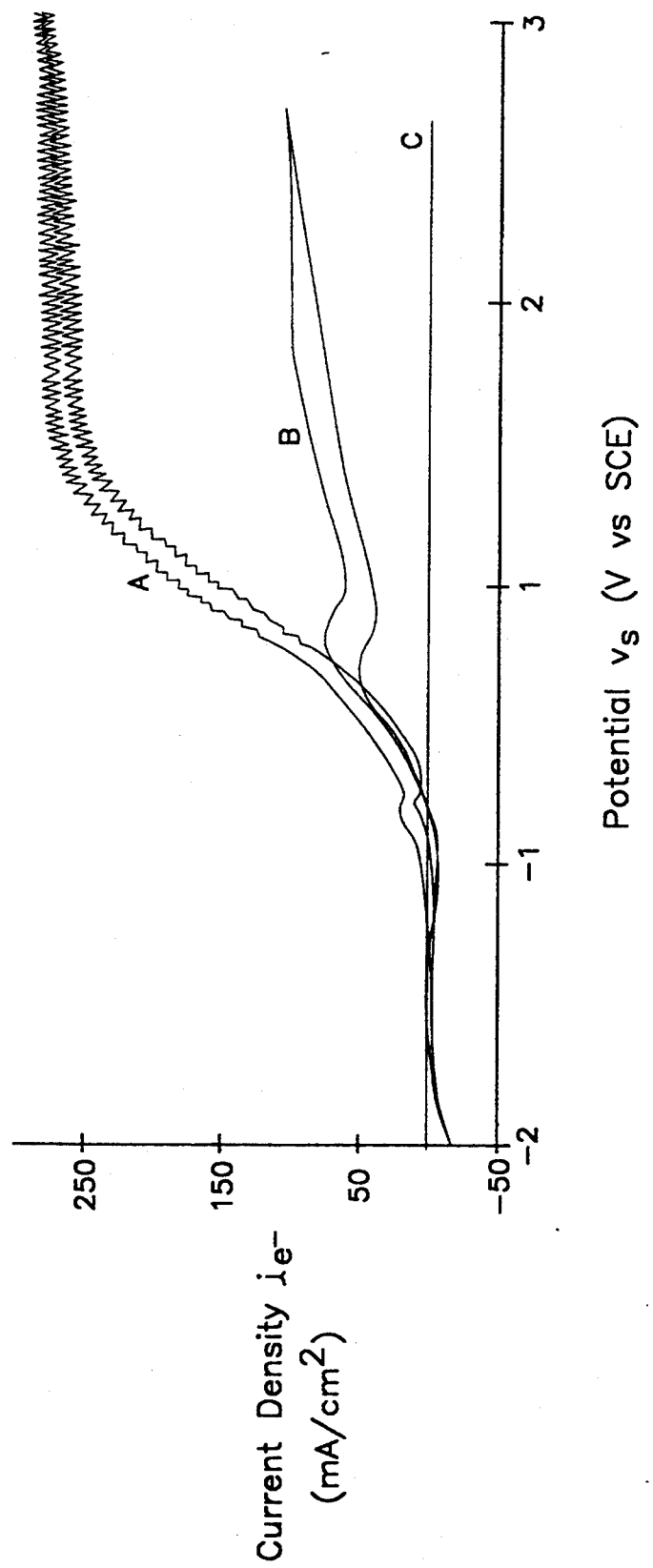
FIG. 2 is a graph illustrating the response of the system of FIG. 1 and showing photocurrent versus potential of n-doped silicon illuminated with light in an electrolytic solution of HF (2M), TBAP (0.25M), MeCN (Curve A) and of HF (2M), NH$_4$F (1M), H$_2$O (Curve B), and in darkness in an electrolytic solution of HF (2M), TBAP (0.25M), MeCN (Curve C)

FIG. 2 is a graph showing the I-V behavior of n-doped Si (scan rate=0.5 V/s) illuminated with a 300 mW/$cm^2$ quartz tungsten halogen light source 15 in HF (2M), TBAP (0.25M), MeCN (Curve A) and in HF (2M), $NH_4F$ (1M), $H_2O$ (Curve B), and furthermore, in darkness in HF (2M), TBAP (0.25M), MeCN (Curve C). Curve C corresponding to the dark current response of n-doped Si in the MeCN solution 24 is similar to the dark current in an aqueous solution 24. The initial potential for the voltage sweeps was negative of the flat band potential ($V_{fb}$) and the sweep direction was toward positive potentials. The onset of the photo-oxidation current was observed with the reference voltage $V_{ref}$ equal to approximately $-0.6$ V and $-0.5$ V versus SCE for the MeCN and water solutions 24, respectively, which is approximately $V_{fb}$ in each solution. This flat band potential is approximately 0.5 V positive of that previously reported by Laser et al., *J. Phys. Chem.*, 80, 459 (1976), but similar to that reported by Byker et al., *J. Electrochem Soc.*, 47, 117 (1990) and Chazalviel et al., *J. Electroanal. Chem. Interfacial Electrochem.*, 114, 229 (1980) in MeCN with TBAP as the supporting electrolyte. At potentials positive of $V_{fb}$, a Schottky barrier is formed within the n-doped Si, and photogenerated holes migrate to the semiconductor-solution interface where they can participate in faradaic processes. At potentials between $-0.5$ and $+0.5$ in the aqueous solution 24 (FIG. 2, curve B), hydrogen bubbles were observed on the Si surface due to the chemical oxidation of reaction intermediates by water. At higher mass transfer rates, the gas evolution increases. The current peak at $+0.3$ V is commonly called the critical current $i_{crit}$. The potential and magnitude of the peak are dependent upon solution pH, doping density, HF concentration, crystal orientation, and illumination intensity. Between the onset current and $i_{crit}$, a porous Si layer is formed. At currents sufficiently greater than $i_{crit}$, the current is limited by the dissolution of the oxide and polishing takes place. Of particular importance in aqueous solution 24 are the observations that the current is not directly proportional to the flux of holes, the current density and reaction products are potential dependent, and oxide intermediates determine the rate and nature of the dissolution. The spatial resolution of the PEC etched features in aqueous solution 24 is limited by the reflection from gas bubbles, and the slow dissolution of the oxides which allows surface diffusion of photogenerated holes.

The I-V behavior of n-doped Si in MeCN with 2M anhydrous HF and 0.25M TBAP is shown in FIG. 2 as curve A. Although positive feedback was used, some uncompensated solution resistance remained which affected the slope of the rising portion of the curve A. The illumination intensity was the same as that for curve B. An intensity limited plateau spanning a wide voltage range with no critical current peak was observed. In contrast to the aqueous system, no hydrogen bubbles were observed at any potential.

Figure 3:
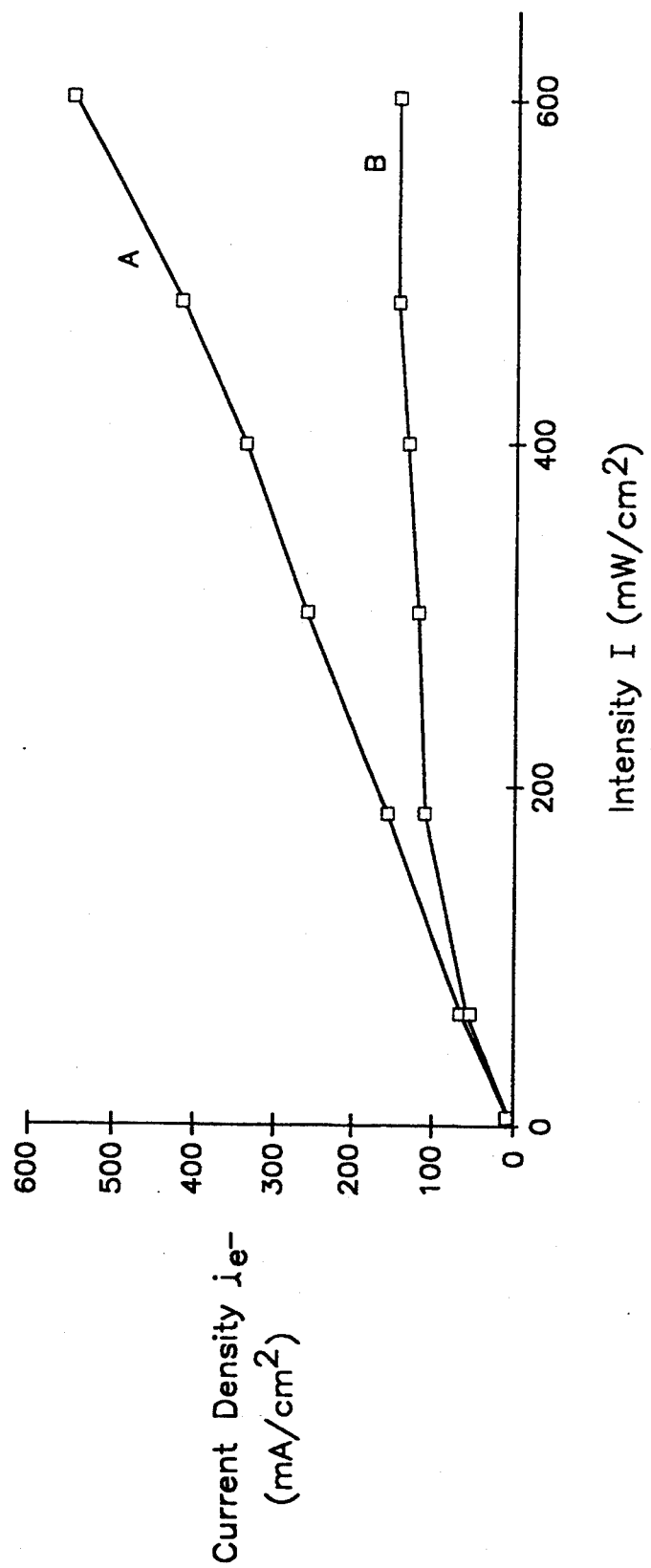
FIG. 3 is a graph illustrating the response of the system of FIG. 1 and showing photocurrent versus light intensity of n-doped silicon in an electrolytic solution of HF (2M) , TBAP (0.25M) , MeCN (Curve A) and of HF (2M) , NH$_4$F (1M) , H$_2$O (Curve B)

The relationship between the photocurrent and illumination intensity was investigated with a white light source 15 and neutral density filters, and is shown in FIG. 3. FIG. 3 is a graph illustrating the response of the system 10 of FIG. 1 and showing photocurrent versus light intensity of n-doped Si in an electrolytic solution of HF (2M), TBAP (0.25M), MeCN (Curve A) and of HF (2M), $NH_4F$ (1M), $H_2O$ (Curve B). In Curve A, the current density was directly proportional to light intensity up to at least 600 mW/$cm^2$, which was the lamp power limit. In the aqueous solution 24 of Curve B, the current was directly proportional to light intensity up to approximately 50 mW/$cm^2$. At higher intensity, the current became nearly independent of light intensity, indicating that the rate limiting process was no longer the supply of holes to the surface, but rather the dissolution of the oxide.

The photon efficiency and number of equivalents per mole were investigated using a 0.62 mW HeNe laser as the light source 15 so that the photon flux could be accurately calculated. The incident intensity was corrected for reflection assuming normal incidence and using the index of refraction at 632.8 nm for each medium through which the beam passed. The measured photocurrent was relatively constant with time. No estimate of recombination within the Si semiconductor 13 was made. The spatial profile of the holes etched in n-doped Si semiconductor 13 using the HF-MeCN solution 24 was gaussian shaped and replicated the intensity profile of the laser beam. In the aqueous HF solution 24, the holes did not replicate the profile of the laser beam, and were significantly shallower due to the lower photocurrent. The volume of Si semiconductor 13 dissolved was determined by assuming radial symmetry and integrating the depth profile of the etched hole. Based on the quantity of Si semiconductor 13 removed, four electrons were associated with the dissolution of each atom of Si in MeCN, at all intensities investigated. This is in contrast to a value of 2 to 4 electrons per Si atom in the aqueous solution 24. Based on the beam power and current, 3.3 electrons were measured in the external circuit for each photon incident on the Si semiconductor 13. The quantum efficiency for the aqueous system using the HeNe laser was 1.2. Thus, each photogenerated hole produces at least 3.3 electrons in the external circuit.

In the aqueous solution 24 at low intensity (less than 5 $\mu W/cm^2$), it has been shown that the quantum efficiency was as high as four electrons per photon (current quadrupling). However, the quantum efficiency in the aqueous solution 24 approached one at higher intensities, and reliable experimental results reportedly could not be obtained at high intensities due to surface oxide formation. The reactions in MeCN are not subject to interference by water. An efficiency of four electrons per photon in MeCN would require that only one of the four electron transfer steps is photo-initiated and the remaining three occur through electron injection.

EXAMPLE 2

A p-doped Si semiconductor 13 was prepared by electrochemical etching in 2.5M HF, 0.25M TBAP, MeCN solution 24 for 10 minutes at 75 mA/cm$^2$. Generally, in the case of a p-doped Si semiconductor 13, radiation 26 is not necessary to initiate the etching reaction. However, radiation 26 may be supplied to facilitate etching and the etching would be proportional to the radiation intensity I.

An n-doped Si semiconductor 13 was etched for 10 minutes using a 0.62 mW HeNe laser with the reference voltage $v_{ref}$ equal to approximately 0.5 V versus SCE.

The surfaces of the etched p-doped and n-doped Si semiconductors 13 were examined using an electron microscope, specifically an SEM. The surface of both semiconductors 13 were similar to the topography of porous Si. Moreover, electroluminescence was observed from the p-doped Si prepared in MeCN when anodized in an aqueous 0.25M KCl solution 24. No luminescence was observed when the p-doped Si semiconductor 13 was anodized in MeCN with 0.25M TBAP. The radiative recombination of electron-hole pairs (electroluminescence) in an aqueous solution 24 occurs during the electrochemical formation of the oxide, which does not occur in the MeCN solution 24.

EXAMPLE 3

To investigate the role of protons in the photo-oxidation of n-doped Si, a 0.5M tetrabutylammonium tetrafluoroborate (TBAFB), MeCN solution 24 was used in the cell 20. The TBAFB was also obtained from Aldrich Chemical Co., and was dried under vacuum. Very dry fluoride salts, such as TBAF, are not stable because of MeCN decomposition. Free fluoride slowly reacts with MeCN to form $HF_2^-$ and $CH_2CN^-$. In MeCN, the dissociation of the fluoroborate ion to $F^-$ and $BF_3$ is sufficient to complex the photo-oxidized Si surface without the presence of protons. This aprotic solvent was used to study the quantum efficiency and number of equivalents/mole for the oxidation of Si. Based on the current and quantity of material removed, 4.2 electrons were observed for the dissolution of each Si atom. The quantum efficiency was 1.9 electrons per photon which is lower than the value of 3.3 for HF in MeCN. The etching of n-doped Si in an TBAFB-MeCN electrolytic solution 24 shows that protons are not required for the photo-oxidation and dissolution process.

CONCLUSIONS

Figure 4B:
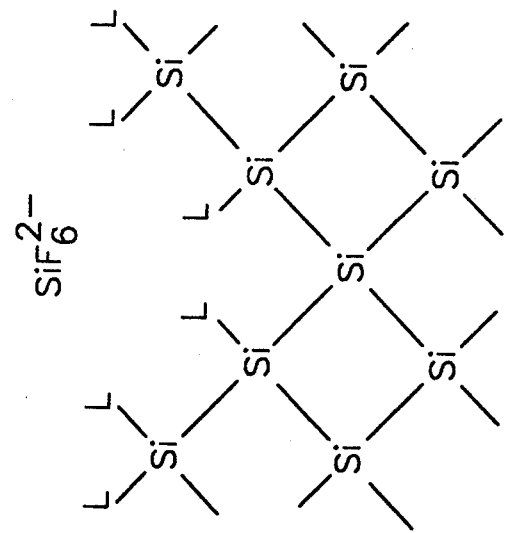
FIG. 4B is a schematic illustration of (100) silicon after oxidation and dissolution of a single silicon atom using the system of FIG. 1.
Figure 4A:
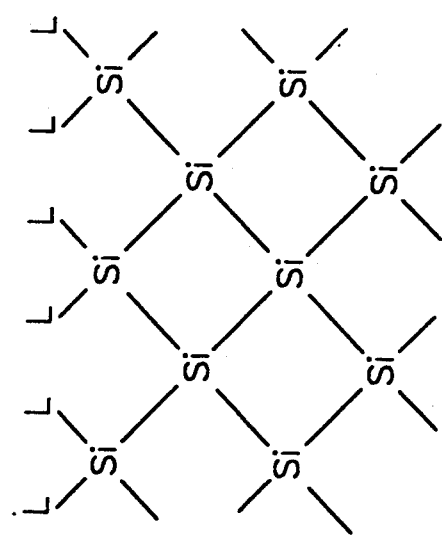
FIG. 4A is a schematic illustration of the surface of n-doped (100) silicon prior to performing PEC etching using the system of FIG. 1.

It is of interest to contrast the mechanism for the oxidation and dissolution of Si in aqueous solutions 24 to these results in MeCN solutions 24. FIG. 4A shows the (100) Si surface terminated by the ligand "L." Both the (100) and (111) Si faces are chemically and electrochemically stable in aqueous and MeCN fluoride containing electrolytes. That is, there is no spontaneous chemical attack of the Si by the electrolyte, and there are very low dark currents (corrosion). Recent investigations suggest that the stable Si surface in aqueous HF solutions 24 is a hydride as opposed to a fluoride surface, see B. R. Weinberger, G. G. Peterson, T. C. Eschrich, and H. A. Krasinski, *J. Appl. Phys.*, 60 3232 (1986). In either case, the reaction sequence in water is initiated by a hole. In the case of a hydride surface, oxidation of one of the Si-H surface bonds reduces the electron density on the Si which is then complexed by fluoride (or hydroxide) and leaves the second Si-H bond susceptible to fluoride (or hydroxide) attack. Electron injection into the semiconductor conduction band then occurs at the second Si-H bond because the fluoride fills the bonding orbital with two electrons and leaves one electron in the antibonding orbital at a sufficiently high energy level. The surface hydrogen atoms leave the Si in the zero valence state and combine to form molecular hydrogen. This accounts for the current doubling (200% quantum efficiency), production of hydrogen and 2 eq./mole for the oxidation of Si to Si(IV) in water. The electron density in the remaining Si-Si bonds is lowered which leaves them susceptible to attack by HF (or water) resulting in $SiF_4$ (to be dissolved as $SiF_6^{2-}$) and the formation of a stable monohydride surface. The stable surface has been discussed as a fluorinated surface, where the ligand is a fluoride. See H. Gerischer and M. Lubke, *Ber. Busenges. Phys. Chem.*, 91, 394 (1987) and H. Gerischer and M. Lubke, *Ber. Busenges. Phys. Chem.*, 92, 573 (1988). XPS studies have suggested monolayer coverages of fluorine on the surface. See B. R. Weinberger, G. G. Peterson, T. C. Eschrich, and H. A. Krasinski, *J. Appl. Phys.*, 60, 3232 (1986). In the case of a $SiF_2$ terminated surface, the hole initiated reaction is not the Si-L bond, but rather the Si-Si bond followed by fluoride attack. The intermediate formed would then be able to inject an electron into the conduction band. In either mechanism, there is a competition between fluoride and hydroxide in the nucleophilic attack.

The mechanism for the oxidation and dissolution of Si in a non-aqueous solution 24 is different from that proposed for aqueous dissolution. In contrast to the mechanism for a hydride surface above, we observe 4 eq./mole and no hydrogen produced which means that if the surface were hydrogen terminated, the leaving group would have to be protons, and not molecular hydrogen. The initial oxidation of the Si-H by a hole would be followed by a proton leaving, nucleophilic attack by a fluoride, and electron injection. The second Si-H would then be more susceptible to fluoride attack because of the polarity of the first Si-F bond, resulting in the proton leaving and up to two additional electron injection steps as the Si-H is oxidized to Si-F plus $H^+$. HF would then add spontaneously across the remaining Si-Si bonds because of their low electron density, leaving a stable hydride surface and a $SiF_4$ group to be further complexed by fluoride. The absence of hydroxide in MeCN eliminate the competition during the nucleophilic attack and formation of the oxide intermediate. If the fluorinated surface were the stable form, the hole initiated first step would be the oxidation of the Si-Si bond followed by fluoride attack and several electron injection steps which are possible because of the ease of oxidation of the intermediates.

The low dark current and chemical stability of Si in the aprotic case, with TBAFB, suggests that the surface of the Si is terminated by fluoride (or fluoroborate). The Si-Si bonds do not undergo spontaneous attack by $F^-$, as they would by HF if the surface were hydrogenated terminated in the discussion above. The likely presence of a fluoride surface and stability of the Si-Si bond to $F^-$ attack in TBAFB, does not necessarily mean that the Si surface is fluoride terminated in HF-MeCN. The reaction of HF with the Si-Si bond can be different from that of $F^-$ because the proton can help stabilize the reaction intermediates by forming Si-H as opposed to leaving a $Si^-$.

In aqueous solutions 24, the competition between the nucleophilic attack of fluoride and hydroxide, can result in the formation of a Si-oxygen bond, particularly at higher currents and lower fluoride concentrations. The slow dissolution of the Si-oxygen bond by fluoride is the rate limiting step in the process. Thus, a saturation current is observed in FIG. 3B. Since the hydroxide concentration is very small in MeCN, the formation of oxides is eliminated. It is interesting that the formation of porous Si does not require the formation of an oxide intermediate, as suggested by Zhang et al., *J. Electrochem. Soc.*, 136., 1561 (1989). Rather, hole initiated oxidation appears to be favored at the Si defect site. In the case of (100) Si, the etched site will be terminated by a single ligand bond, Si-L, similar to that of an exposed (111) surface, a shown in FIG. 4B.

It will be obvious to those skilled in the art that many modifications may be made to the preferred embodiments and examples described hereinbefore, which were chosen for the purpose of illustrating the present invention, without substantially departing from the principles of the present invention. All such modifications are intended to be included herein within the scope of the present invention, as set forth in the following claims.

Wherefore, the following is claimed:

1. A system for high speed photoelectrochemical etching of silicon at an etching rate proportional to light intensity, comprising:
   means for containing a silicon semiconductor in an electrolytic solution, said electrolytic solution being substantially anhydrous and having a fluoride;
   means for applying a potential to the semiconductor which is between the maximum potential of the valence band of said semiconductor and the minimum potential of the conduction band of said semiconductor; and
   means for illuminating a surface part of said semiconductor to be etched with radiation of sufficient energy to produce holes in said valence band.

2. The system as set forth in claim 1, wherein said means for containing said silicon semiconductor comprises a container having teflon walls, a bottom surface formed of said silicon semiconductor, and a top surface formed of a transparent lid.

3. The system as set forth in claim 1, wherein said means for applying said potential comprises a first electrode inserted into said electrolytic solution and a second electrode contacting an outside surface of said silicon semiconductor.

4. The system as set forth in claim 3, further comprising means for monitoring said etching rate of said photoelectrochemical etching, said monitoring means comprising a potentiostat having a current detector for detecting an amount of current flowing from said second electrode to said first electrode.

5. The system as set forth in claim 1, further comprising means for monitoring said etching rate of said photoelectrochemical etching.

6. The system as set forth in claim 1, wherein said means for illuminating said surface of said semiconductor produces radiation with energy at least equal to a bandgap of said silicon semiconductor.

7. The system as set forth in claim 1, wherein said means for illuminating said surface of said semiconductor comprises a broadband light source.

8. The system as set forth in claim 1, wherein said means for illuminating said surface of said semiconductor comprises a monochromic light source.

* * * * *